United States Patent [19]

Kaneko

[11] Patent Number: 5,047,673
[45] Date of Patent: Sep. 10, 1991

[54] HIGH SPEED OUTPUT STRUCTURE SUITABLE FOR WIRED-OR STRUCTURE

[75] Inventor: Hiroaki Kaneko, Tokyo, Japan

[73] Assignee: NEC Corporation, Tokyo, Japan

[21] Appl. No.: 474,284

[22] Filed: Feb. 2, 1990

[30] Foreign Application Priority Data

Feb. 3, 1989 [JP] Japan .................................. 1-24857

[51] Int. Cl.$^5$ .................... H03K 19/02; H03K 19/096
[52] U.S. Cl. ..................................... 307/480; 307/443;
307/448; 307/473; 307/481; 307/263; 307/594
[58] Field of Search ............... 307/443, 448, 451, 473,
307/480-481, 263, 594

[56] References Cited

U.S. PATENT DOCUMENTS 4,612,466  9/1986  Stewart ............................... 307/473
4,680,491  7/1987  Yokouchi et al. ................... 307/473
4,820,942  4/1989  Chan ................................... 307/473
4,877,978  10/1989  Platt ................................... 307/473
4,933,579  6/1990  Isobe et al. .......................... 307/473
4,939,392  7/1990  Shubat et al. ....................... 307/473

Primary Examiner—Stanley D. Miller
Assistant Examiner—Margaret Rose Wambach
Attorney, Agent, or Firm—Helfgott & Karas

[57] ABSTRACT

An output circuit contains an output transistor connected between an output terminal and a reference voltage terminal, a precharge transistor connected between the output terminal and a power voltage terminal and a control circuit for controlling the precharge circuit. The control circuit renders the precharge transistor conductive temporarily when the output transistor is changed from the conductive state to the non-conductive state.

8 Claims, 5 Drawing Sheets

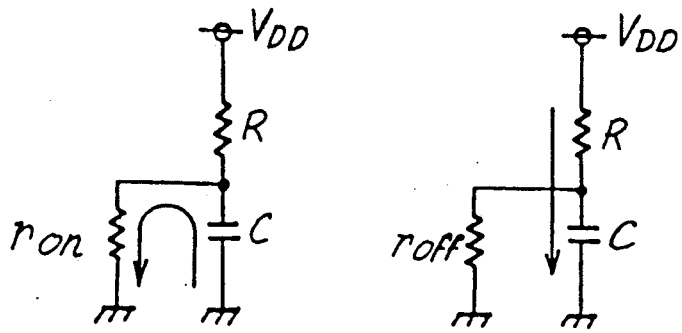
PRIOR ART
FIG.2A
PRIOR ART
FIG.2B
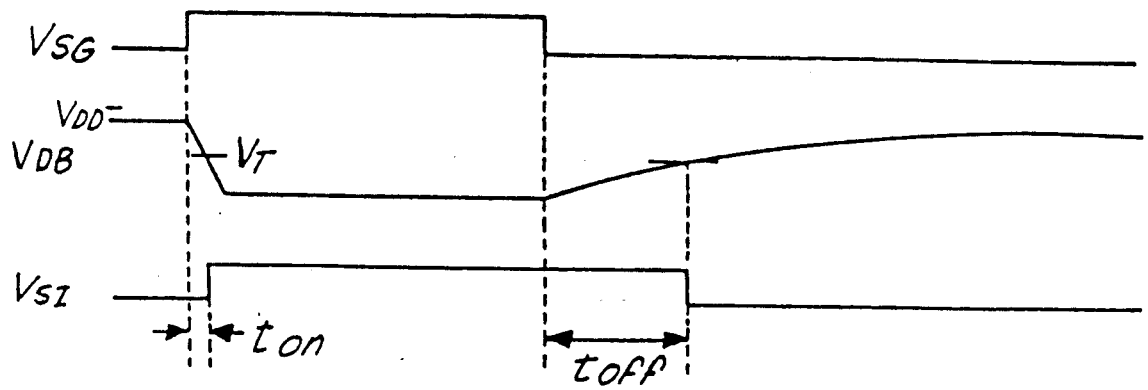
PRIOR ART
FIG.3

HIGH SPEED OUTPUT STRUCTURE SUITABLE FOR WIRED-OR STRUCTURE

BACKGROUND OF THE INVENTION

1. Field of the Invention

The present invention relates to an output circuit having an output terminal which assumes a logic output state generating a logic signal and a high impedance state (Hi-Z state) suitable for constructing a wired logic structure therewith.

2. Description of the Related Art

Open collector type or open drain type output circuits are widely utilized to form wired logic structures by connecting output terminals of the output circuits in common to a common data line. The open drain type output circuit has a structure in which a driving MOS transistor is connected between the output terminal and a ground voltage terminal and no load element is provided between the output terminal and a power voltage terminal within the output circuit. The wired-OR structure is realized by connecting in common output terminals of a plurality of open drain type output circuits to a common data line and an external load element such as a resistor element is provided between the common data line and the power voltage terminal. The common data line assumes a high level near the power voltage through the external load element when none of the driving transistors of the output circuits is energized and a low level approximately of the ground voltage when at least one of the driving transistor is energized. The common data line is provided with a relatively large capacitance which forms a time constant together with a resistance of the external load element. If the resistance of the external load element is set at a small value, it is possible to raise the potential at the common data line at a high speed when none of the driving transistors is energized. However, a large amount of DC current is caused through the external load element when at least one of the driving transistors is conductive, resulting in a large power consumption. In addition, in this instance the low level at the common data line is determined by a ratio of the resistance of the external load element and the on-resistance of the driving transistor, it is necessary to employ a large transistor as the driving transistor to attain the low level sufficiently close to the ground voltage. This lowers the integration density of the output circuit.

SUMMARY OF THE INVENTION

It is an object of the present invention to provide an output circuit suitable for the wired logic structure which can drive an output terminal at a high speed.

It is another object of the present invention to provide an output circuit which can operate with the reduced amount of power consumption.

The output circuit according to the present invention comprises an output transistor having a current path coupled between an output terminal and a reference voltage terminal and a control terminal, a signal generating circuit for operatively supplying the control terminal of the output transistor with one of a first level which renders the output transistor conductive and a second level which renders the output transistor non-conductive, a switch circuit having a current path connected between the output terminal and a power voltage terminal, and a control circuit responsive to the level at the control terminal for controlling the switch circuit, the switch circuit temporarily rendering the switch circuit conductive when the level of the control terminal of the output transistor changes from the first level to the second level.

According to the output circuit of the present invention, in the case where the wired logic structure is formed by connecting the output terminal of the output circuit to the common data line, the switch circuit is energized at the time when the common data line is to be raised in potential after the output transistor is turned to the non-conductive state from the conductive state. Therefore, the common data line is rapidly raised to the high level near the power voltage through the switch circuit, and after the rise in the potential at the common data line the switch circuit is disenabled to preevent the DC current flowing therethrough in the subsequent data period.

Accordingly, it becomes possible to realize an output circuit which can raise the common data line connected thereto at a high speed at the transition in the states of the common data line and operate with the reduced amount of power consumption.

BRIEF DESCRIPTION OF THE DRAWINGS

The above and further objects, features and advantages of the present invention will become more apparent from the following detailed description taken in conjuction with the accompanying drawings, wherein:

FIG. 2A and FIG. 2B are schematic diagrams for explaining the operation of the system in FIG. 1;

FIG. 3 is a timing chart showing the waveform of the wired OR output of the system in FIG. 1;

DETAILED DESCRIPTION OF THE INVENTION

Description of the Prior Art

Figure 1:
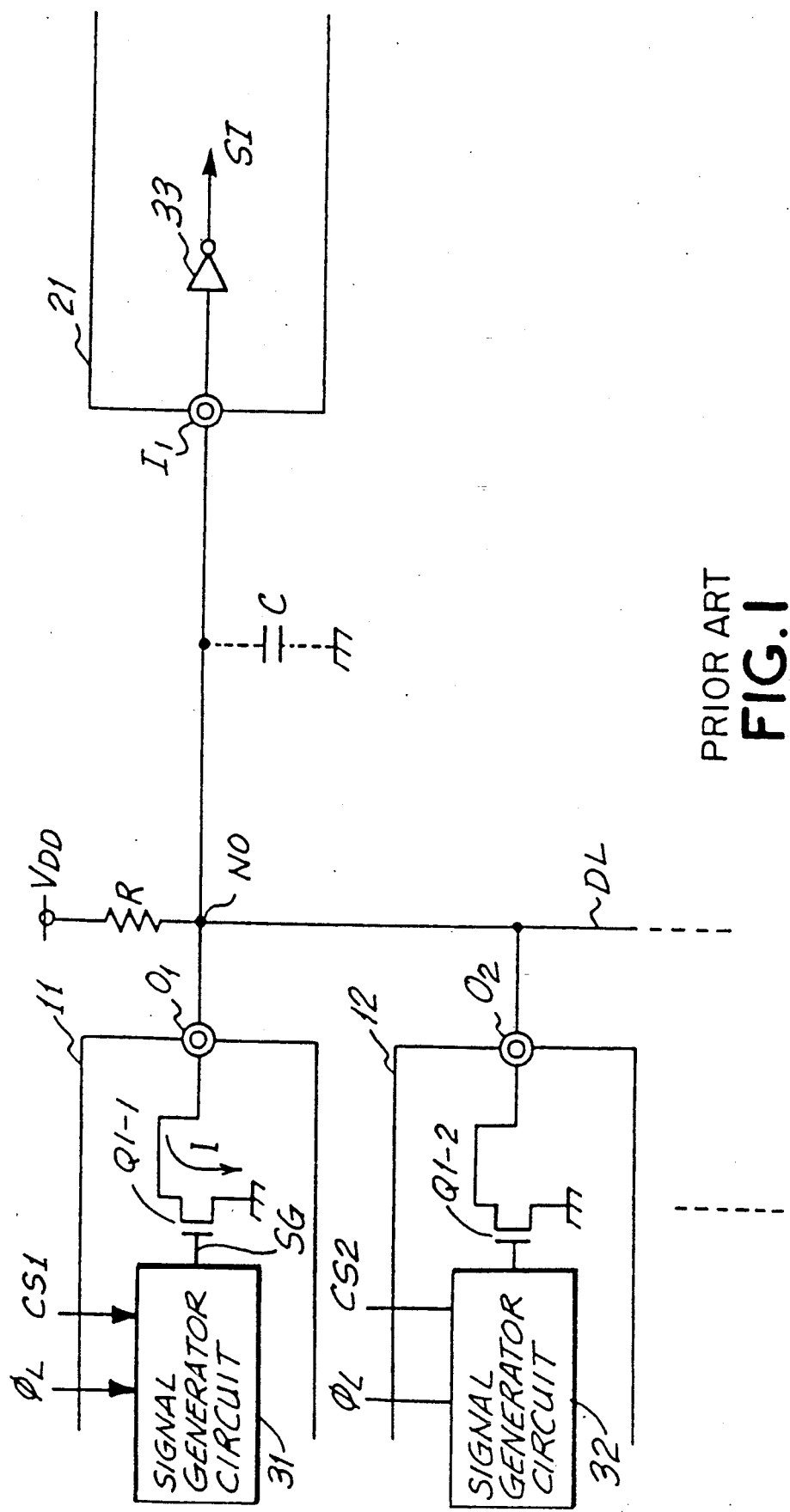
FIG. 1 is a block diagram showing major parts of a wired OR system constructed using the prior art output circuit.

With reference to FIGS. 1 to 3, a wired OR logic stucture constructed by using a plurality of circuit blocks having output transistors according to the prior art open drain structure will be described.

FIG. 1 shows a wired logic configuration using the prior art open drain type output circuits 11 and 12.

In the present construction an output terminal $O_1$ of a circuit block 11, an output terminal $O_2$ of a circuit block 12 and an input terminal $I_1$ of a circuit block 21 are connected to a common data line DL, and the common data line DL is connected to a power terminal $V_{DD}$ via a load resistor R. The circuit block 11 has an open drain type output transistor $Q_{1-1}$ whose drain is connected to the output terminal $O_1$ and a signal generating circuit 31 which generates a driving signal SG by receiving a clock $\phi_L$ and a chip select signal $CS_1$. The circuit block 12 has similarly an open drain type output transistor $Q_{1-2}$ and a signal generating circuit 32 which drives the transistor $Q_{1-2}$ by receiving the clock $\phi_L$ and a chip select signal $CS_2$. The circuit block 21 has an input inverter 33 whose input is connected to an input terminal $I_1$ and whose internal signal SI is taken out from its output. Each of the circuit blocks 11, 12 and 21 is typically constructed as an integrated circuit.

The inverter 33 in the block 21 detects that the output terminal $O_1$ or $O_2$ has output a low level ("0") signal. On the other hand, when neither of the outputs $O_1$ and $O_2$ is at a low level ("0"), the data line DL goes to a high level ($V_{DD}$) through the load element R.

When both of the transistors $Q_{1-1}$ and $Q_{1-2}$ are turned off and are in the Hi-Z state, the signal $V_{DL}$ of the common data line is at "1" level. When either one of the transistors $Q_{1-1}$ and $Q_{1-2}$ or both of them are in the on-state, the data line DL goes to the "0" level, and an on-current I flows from the load resistor R the transistor $Q_{1-1}$ or $Q_{1-2}$.

Now, when the transistor $Q_{1-2}$ is turned off, the state of the data line DL is determined by the on or off state of the transistor $Q_{1-1}$. First, when the transistor $Q_{1-1}$ is in the off-state the signal $V_{DL}$ is given by the potential $V_{off} = V_{DD} \times [r_{off}/2(R + r_{off}/2)]$ obtained by dividing the source voltage $V_{DD}$ by the resistance R and the resultant $r_{off}/2$ of the off-resistance $r_{off}$ of each of the transistors $Q_{1-1}$ and $Q_{1-2}$.

Since, however, the impedance R of the load resistor R that is generally used is several kiloohms due to the reason that will be described later and $r_{off}$ is normally tens of megaohms which is about one thousand times as large the resistance of the load resistance R, $V_{off}$ is nearly equal to $V_{DD}$.

On the other hand, when the transistor $Q_{1-1}$ is in the on-state, the signal $V_{DL}$ becomes the potential $V_{on} = V_{DD} \times [r_{on}/R + r_{on})]$ obtained by dividing the source voltage $V_{DD}$ by the load resistance R and the on-resistance $r_{on}$ of each of the transistors $Q_{1-1}$ and $Q_{1-2}$. Since $r_{on}$ is generally set to tens of ohms, although it may vary with the geometrical construction of the transistors $Q_{1-1}$ and $Q_{1-2}$, $V_{on}$ is about one hundredth of $V_{DD}$ (namely, about 0.05 V when $V_{DD}$ is 5 V).

Now, the data line DL is accompanied with a stray capacitance component C. The capacitance component C is the result of synthesis of the wiring capacitance of the data line DL, the capacitances of the terminals $O_1$, $O_2$ and $I_1$ and the like, and forms a time constant together with the load resistor R.

When the transistor $Q_{1-1}$ makes transition from the off state to the on state, the charge on the capacitor component C that was charged during the off state is discharged through the on resistance $r_{on}$ of the transistor $Q_{1-1}$ as shown in FIG. 2A. Further, when the transistor $Q_{1-1}$ makes transition from the on to the off state, the capacitor component C which is in the state discharged during the on state will be charged through the impedance R of the load resistor R as shown in FIG. 2B.

Consequently, the potential $V_{DL}$ of the data line DL makes transition by the time constant $t_{on} = Cr_{on}$ or $t_{off} = CR$ as shown in FIG. 3. In general, the reactance C is several hundred picofarads so that the $t_{on}$ is in the order of several nanoseconds and $t_{off}$ is in the order of several hundred nanoseconds. Since the inverter 33 will not actually detect logic "1" until $V_{DL}$ exceeds the threshold $V_T$ of logic "1" of the $V_{DL}$, there is generated a time difference between the detection of a level change in the input to the transistor $Q_{1-1}$ and the detection of a level change by the inverter 33.

As described in the above, when a transition from the "0" state to the "1" state takes place in the wired circuit, there is generated a delay before the input circuit detects logic "1". This implies that when the input terminal samples the signal state synchronized with the operating clock, the sampling timing is delayed by a time which is a multiple of the clock. The frequency of the operating clock of the recent microprocessor is higher than 20 MHz (shorter than 50 ns per clock), so that there is a shortcoming that when the delay time is 500 ns, the delay in the detection is of the order of 10 clocks.

In order to reduce the charge delay time of the wired circuit, it is only needed logically to decrease the impedance of the load resistor to a value comparable to the on-resistance (tens of ohms) of the driving transistor. However, the on-current to be pulled in the driving transistor is increased at the same time so that it becomes necessary to use a transistor with high driving capability. In particular, when the wired circuit is to be mounted on an integrated circuit, there is a difficulty in that the problems related to the increase in the transistor area and the consumed power become serious.

Description of the Invention

Figure 4:
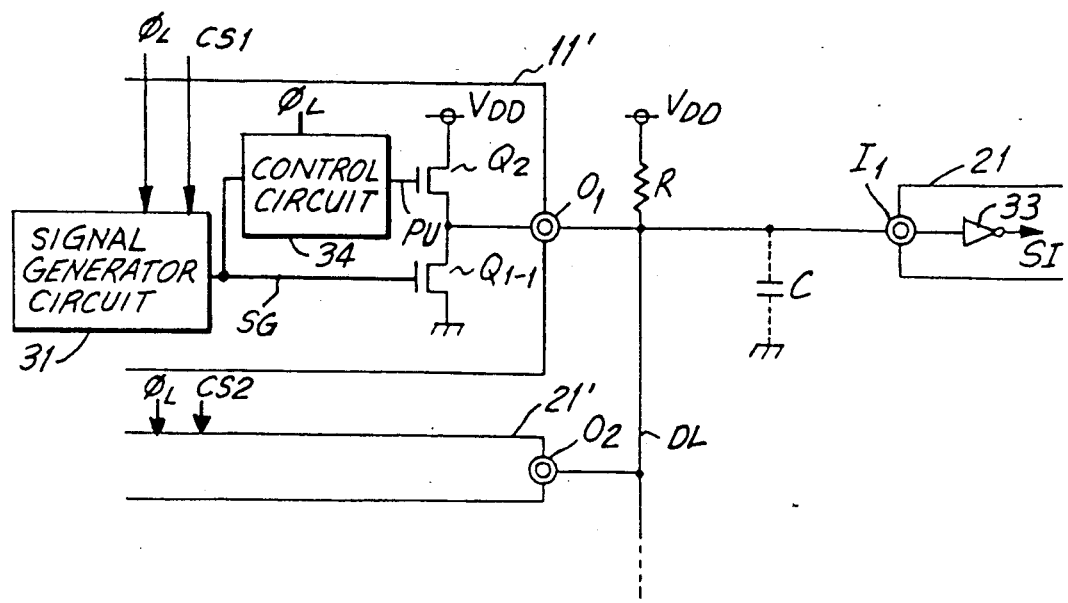
FIG. 4 is a block diagram showing major parts of the wired OR logic system constructed using an output circuit according to an embodiment of the present invention.
Figure 5:
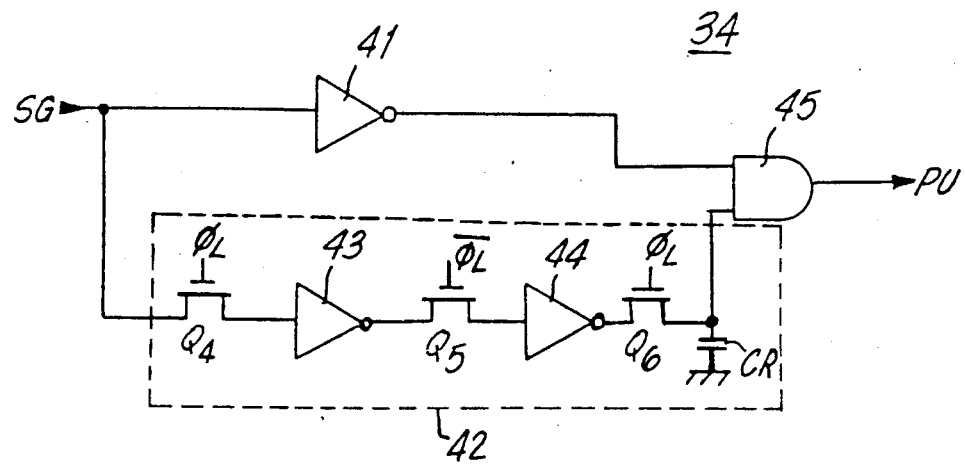
FIG. 5 is a circuit diagram showing a configuration example of a control circuit in FIG. 4.
Figure 6:
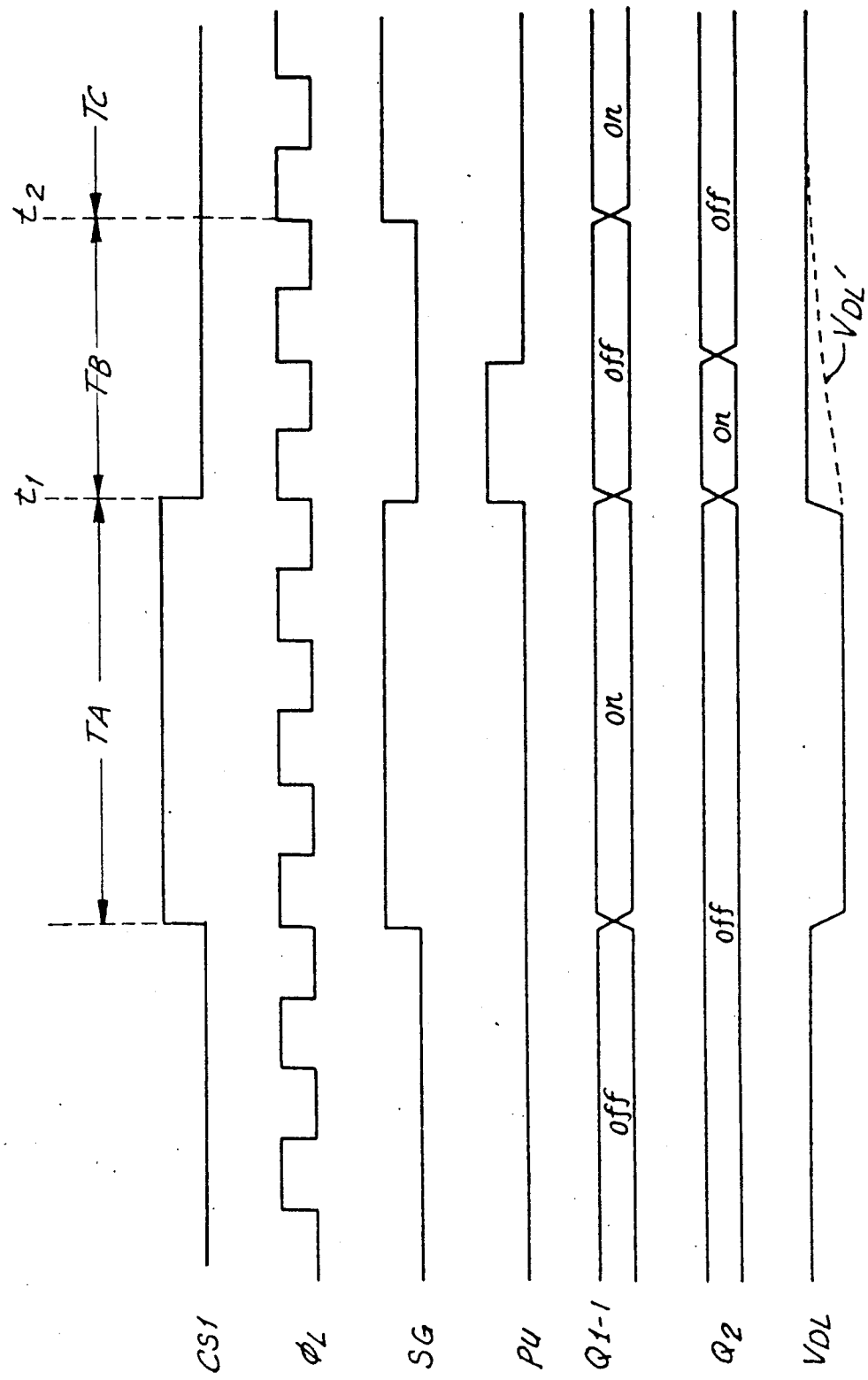
FIG. 6 is a timing waveform diagram for explaining the operation of the embodiment in FIG. 5.

Referring to FIG. 4 through FIG. 6, an embodiment of the present invention will be described. In the drawings of FIG. 4 and thereafter component parts corresponding to those in FIG. 1 to FIG. 3 will be assigned identical or similar reference symbols, and their detailed description will be omitted.

A circuit block 11' according to the present invention shown in FIG. 4 is realized by adding a charging transistor $Q_2$ and a control circuit 34 which temporarily (for one cycle period of the clock $\phi_L$, for example) energizes the charging transistor $Q_2$ by detecting the change in the signal SG from a high level to a low level. A circuit block 21' also has a construction similar to that of the circuit block 11', but it is energized with a period different from that of the circuit block 11' by the chip select signal $CS_2$.

Namely, in the present invention, the circuit blocks 11' and 21' are exclusively energized by the chip select signals $CS_1$ and $CS_2$, respectively, and they are so controlled as not to permit the simultaneous driving of the common data line DL with the plurality of circuit blocks 11' and 21'.

That is, the driving transistor $Q_{1-1}$ in the circuit block 11' outputs a "0" signal to the output terminal $O_1$ when the signal SG is active ("1" level), and sets $O_1$ at a Hi-Z state when the signal SG is inactive ("0"). The driving transistor $Q_2$ is a transistor used for connecting the output terminal $O_1$ to the supply voltage $V_{DD}$, and outputs to the output terminal $O_1$ a signal with "1" level when the input PU is active ("1"), and sets $O_1$ at the Hi-Z state when the input PU is inactive ("0").

The control circuit 34 detects the level change in the input SG to the driving transistor $Q_{1-1}$ from active to inactive, and generates a pulse with one clock width which becomes the input to the charging transistor $Q_2$.

An example of the control circuit 34 is shown in FIG. 5. The control circuit 34 comprises an inverter 41 having an input end receiving the signal SG, a delay circuit 42 having an input end receiving the signal SG and having a delay characteristics for delaying its input signal by one cycle period of the clock signal $\phi_L$, and an AND gate 45 which receives the output of the inverter 41 and the output of the delay circuit 42. The AND gate 42 generates the signal PU from its output end when both of the outputs of the inverter 41 and the delay circuit 42 are active in levels.

An example of the delay circuit 42 is constructed by a transfer gate transistor $Q_4$ having a gate receiving the clock signal $\overline{\phi_L}$, an inverter 43 having an input end coupled to the transistor $Q_4$, a transfer gate transistor $Q_5$ having a gate receiving a signal $\phi_L$ opposite to $\phi_L$ in phase, an inverter 44 coupled to the transistor $Q_5$, and a transfer gate transistor $Q_6$ having a gate receiving $\phi_L$. In the delay circuit 42, the signal SG is input to the inverter 43 when the clock $\phi_L$ is at an active (high) level, and then the output of the inverter 43 is applied to the input of the inverter 44 by energizing the transistor $Q_5$ when the clock $\phi_L$ is inactive and the clock $\overline{\phi_L}$ is active. When the clock $\phi_L$ becomes next active, the transistor $Q_6$ is rendered conductive and its output is input to the AND gate 45. In this way, the signal SG is input to the AND gate 45 by being delayed by one cycle period of the clock $\phi_L$. The capacitor CR is placed on the output side of the transistor $Q_6$, and holds the condition immediately before the transistor $Q_6$ is turned off.

In the control circuit 34, when the signal SG changes from a high level to a low level, the output of the inverter 41 follows to make a transition from a low to a high level. On the other hand, the output of the delay circuit 42 remains at a high level for the period of one clock. In this manner, during the one clock cycle period following the change of the signal SG from a high to a low level, there is output from the gate 45 an active (high) level signal that energizes the transistor $Q_2$.

Next, with reference to FIG. 6, the operation of the present embodiment will be explained.

In FIG. 6, there is illustrated the case in which the chip select signal $CS_1$ is active during a period $T_A$ to select the circuit block 11', then after the period $T_B$ of two clock cycles, the block 11' is selected again by the signal $CS_1$ for a period of $T_C$. Since the signal PU is inactive during the period $T_A$ where the signal SG is active, the charging transistor $Q_2$ stays turned off. On the other hand, the driving transistor $Q_{1-1}$ is turned on which drives the output terminal to the "0" level. With the signal $CS_1$ going to inactive at time $t_1$ and the signal SG changing from active to inactive level synchronized with the operating clock $\phi_L$, the driving transistor $Q_{1-1}$ goes to the off level and the output terminal $O_1$ is isolated from the ground level (namely, set at the Hi-Z state). On the other hand, since the control circuit 34 detects the transition of the signal SG to an inactive level, it generates a pulse PU having one clock width during the period $T_B$, turning on the charging transistor $Q_2$. Therefore, the output terminal $O_1$ is connected to the source potential $V_{DD}$ for the period of one clock.

With the elapse of one clock after the change of the signal SG to the inactive level, the output PU of the control circuit 34 thereafter goes to inactive, so that the charging transistor $Q_2$ also goes to the off state and the output terminal $O_1$ is isolated from both of the source voltage $V_{DD}$ and the ground (set to a Hi-Z state). At this point, both of the driving transistor $Q_{1-1}$ and the charging transistor $Q_2$ are in the off state, so that the output terminal $O_1$ goes to a Hi-Z state when it is in an open state (state in which none is completed externally). Since, however, the output terminal $O_1$ is externally connected to the source potential $V_{DD}$ via the load resistor R, the data line DL which is connected to the output terminal $O_1$ can hold the source potential $V_{DD}$ even when the output terminal $O_1$ itself produces a Hi-Z state.

As explained above, since "1" level with one clock cycle period is generated at the time when the signal SG changes from an active level to the inactive level and the output terminal $O_1$ changes from the "0" output state to the Hi-Z state, the time at which the data line DL changes from the "0" output level to the "1" output level is determined solely by the time of turning on the charging transistor $Q_2$.

It is to be mentioned that the waveform $V_{DL}$, given by the broken line covering the period $T_B$ for the signal $V_{DL}$ of the data line DL in FIG. 6 shows the $V_{DL}$ for the case of absence of the transistor $Q_2$, namely, for the case of the prior art.

Since there does not exist an essential difference in the times of turning on the charging transistor $Q_2$ and the driving transistor $Q_{1-1}$ as described in the above, it becomes possible in the present invention to drive the data line DL irrespective of the time constant that is determined by the capacitor component C and the load resistor R, and independent of the sense of the signal change (namely, the sense of the signal level change in "0"→"1" or "1"→"0").

Next, referring to FIG. 7, another embodiment of the present invention will be described.

In the embodiment shown in FIG. 4, it was necessary to premise that the circuit blocks 11' and 21' can be operated independently under the control of the signals $CS_1$ and $CS_2$, respectively. Without the premise, in driving the signal line DL at $V_{DD}$ for one clock period by the circuit block 11', if the circuit block 21' drives the data line DL to logic "0" at the same timing, there arises a possibility of giving damages to both of the transistors due to flow of an excessive current (through current) for a long time (for a period of one clock width), because of the occurrence of a condition in which both of the charging transistor $Q_2$ of the circuit block 11' and the driving transistor $Q_{1-2}$ of the circuit block 21' are turned on.

Figure 7:
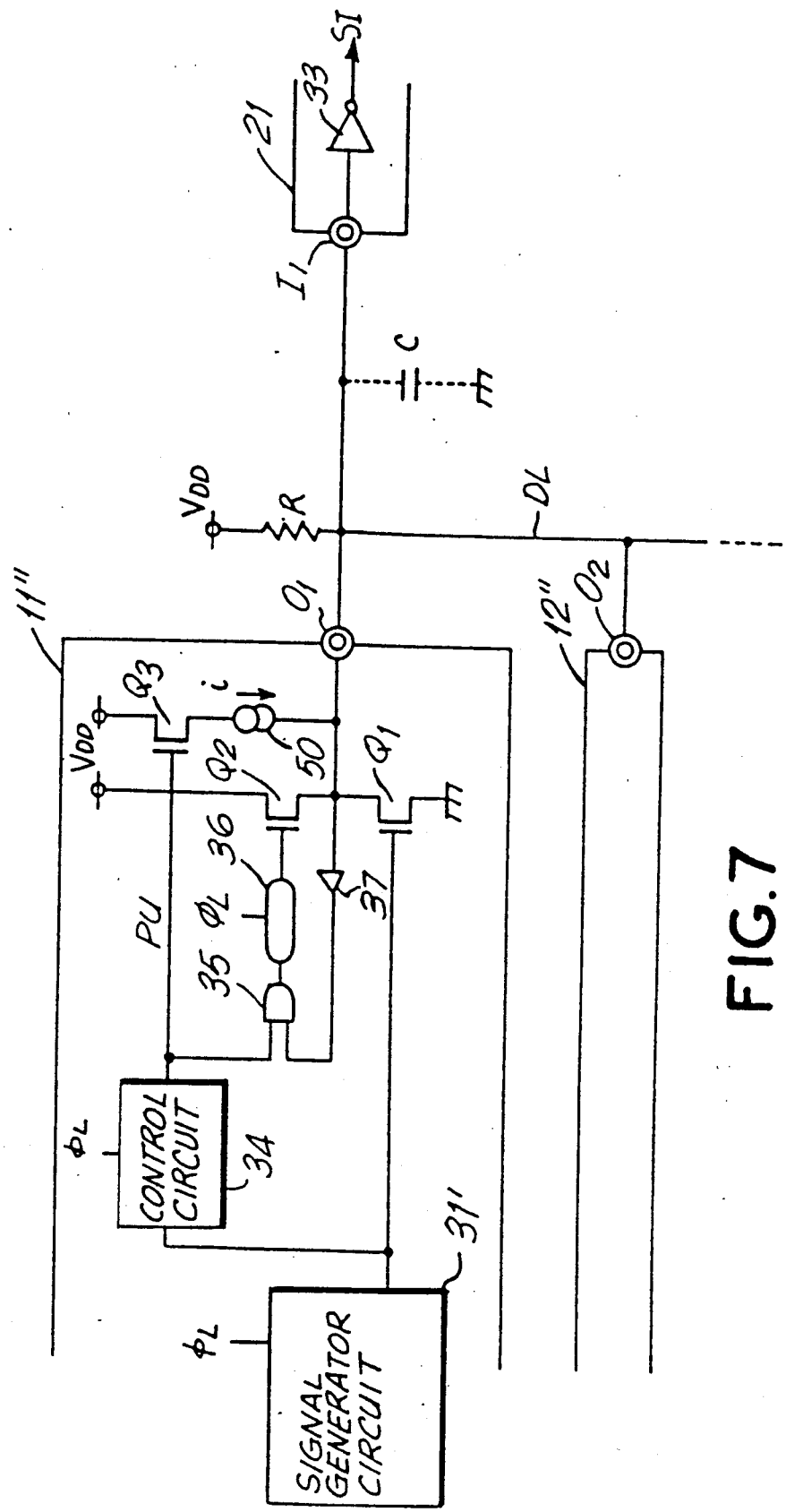
FIG. 7 is a block diagram showing another embodiment of the present invention.

In view of the above, in the present embodiment it is contrived to eliminate the limitations concerning the timing of the above-mentioned driving, as indicated in FIG. 7. Namely, in comparison to the embodiment in FIG. 4, the present embodiment includes a constant current source 50 that generates a current i, a current driving transistor $Q_3$ for turning on and off the constant current source 50, a voltage sensor 37 for detecting that the voltage level of the output terminal $O_1$ exceeded a predetermined value $V_L$, a two-input AND gate 35 for masking the output PU of the control circuit 34 when the voltage level of the output terminal $O_1$ detected by the voltage sensor 37 does not exceed $V_L$, and a delay element 36 for delaying the output of the two-input AND gate 35 by the period of one clock. In the present invention, when a signal PU with one clock width is generated, first, a constant current i is supplied to the output terminal $O_1$ by turning on the current driving transistor $Q_3$. If at this time the output terminal $O_2$ of the circuit block 12" is not driving the data line DL to a "0" level, the voltage level $V_{DL}$ of the signal line DL exceeds $V_L$ so that the output of the voltage sensor 37 goes to active, the charging transistor $Q_2$ is turned on one clock after the generation of the signal PU, and connects the data line DL directly to the source voltage $V_{DD}$.

On the other hand, if the output terminal $O_2$ is driving the data line DL to a "0" level at the time of generation of the signal PU, the current i that flows out of the constant current source 50 is absorbed into the output terminal $O_2$, so that the voltage level $V_{DL}$ of the data line DL will not exceed $V_L$. Therefore, the output of the voltage sensor 37 becomes inactive so that the charging transistor $Q_2$ remains turned off even one clock after the generation of the signal PU, and the signal line DL maintains the "0" level.

As in the above, according to the present embodiment, at a timing for which the drivings of the $V_{DD}$ and the logic "0" from different output terminals might complete, the flow of an excessively large current can be prevented by first checking whether there will occur by supplying a constant current in the common signal line, and then executing the driving to the $V_{DD}$ after confirming that such a competition will not take place.

As described in the foregoing, by the adoption of the present invention it is possible to realize a wired circuit structure which permits a high speed transition not only from an inactive state to an active state but also from an active state to an inactive state.

In particular, the present invention has an effect of realizing a high-speed wired configuration with smaller number of terminals for LSIs with limited number of terminals.

What is claimed is:

1. An output circuit comprising a first voltage terminal receiving a first voltage, a second voltage terminal receiving a second voltage, a clock terminal receiving a clock signal, an output transistor having a current path connected between an output terminal and said second voltage terminal and a control terminal, a signal generating circuit coupled to said clock terminal for operatively supplying said control terminal of said output transistor with one of a first level rendering said output transistor conductive and a second level rendering said output transistor non-conductive in synchronism with said clock signal, a switch circuit having a current path connected between said output terminal and said first voltage terminal, and a control circuit coupled to said signal generating circuit for controlling said switch circuit, said control circuit temporarily rendering said switch circuit conductive during a cycle period of said clock signal when the level at said control terminal of said output transistor changes from said first level to said second level.

2. The output circuit according to claim 1, in which said switch circuit includes a charging field effect transistor having a source-drain path coupled between said output terminal and said first voltage terminal.

3. The output circuit according to claim 1, in which said control circuit includes an inverter having an input end coupled to said control terminal of said output transistor, a delay circuit having an input end coupled to said control terminal of said output transistor, and a logic gate having first and second input terminals connected to output ends of said inverter and said delay circuit, respectively, said delay circuit delaying a signal at the input end thereof for one cycle period of said clock signal.

4. An output circuit comprising:
first switch means having a current path connected between an output terminal and a first voltage terminal;
a clock terminal receiving a clock signal;
signal generating means connected to a control terminal of said first switch means for selectively supplying to said control terminal a first level which enables said first switch means and a second level which disenables said first switch means in synchronism with said clock signal;
second switch means having a current path connected between said output terminal and a second voltage terminal; and
control means for enabling said second switch means for a predetermined period corresponding to a cycle period of said clock signal when the potential of said control terminal of said first switch means is changed from said first level to said second level.

5. The output circuit according to claim 4, wherein said control means comprises an inverter circuit which receives the output of said signal generating means, a clocked delay circuit which receives the output of said signal generating means at an input end thereof and delaying a signal at said input end for a period corresponding to the cycle period of said clock signal, and an AND gate which receives the output of said inverter circuit and the output of said delay circuit.

6. The output circuit according to claim 4, wherein each of said first and second switch means includes a field effect transistor.

7. A wired-OR system comprising a common data line; an input circuit having an input coupled to said common data line; and an output circuit having an output end coupled to said common data line, said output circuit including a clock input terminal receiving a clock signal, first switch means having a current path connected between an output terminal and a first voltage terminal, signal generating means connected to a control terminal of said first switch means for selectively supplying to said control terminal a first level which enables said first switch means and a second level which disenables said first switch means in synchronism with said clock signal, second switch means having a current path connected between said output terminal and a second voltage terminal, and control means for enabling said second switch means for a predetermined period corresponding to a cycle period of said clock signal when the potential of said control terminal of said first switch means is changed from said first level to said second level.

8. The system according to claim 7, further comprising a pull-up circuit coupled between said common data line and said second voltage terminal.

* * * * *